(12) United States Patent  (10) Patent No.: US 8,405,410 B2
Kawashima  (45) Date of Patent: Mar. 26, 2013

(54) DETECTION APPARATUS AND METHOD FOR SUPERCONDUCTING COIL QUENCH

(75) Inventor: Hiroshi Kawashima, Hyogo (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 396 days.

(21) Appl. No.: 12/616,857

(22) Filed: Nov. 12, 2009

(65) Prior Publication Data

US 2010/0253373 A1    Oct. 7, 2010

(30) Foreign Application Priority Data

Nov. 12, 2008 (JP) ................... 2008-289982

(51) Int. Cl.
  *G01R 27/08* (2006.01)
  *H02H 7/00* (2006.01)
  *G01F 23/24* (2006.01)
(52) U.S. Cl. ........................... 324/706; 381/19; 505/160
(58) Field of Classification Search ................... 324/706; 361/19
  See application file for complete search history.

(56) References Cited

U.S. PATENT DOCUMENTS

| | | | |
|---|---|---|---|
| 4,695,932 A | | 9/1987 | Higashino |
| 4,777,437 A | * | 10/1988 | Tashiro et al. ............... 324/248 |
| 7,342,757 B2 | * | 3/2008 | Huang et al. ................. 361/23 |
| 7,649,720 B2 | * | 1/2010 | Markiewicz .................. 361/19 |
| 2007/0053116 A1 | * | 3/2007 | Ichikawa et al. ............. 361/19 |
| 2009/0046399 A1 | * | 2/2009 | Kurusu et al. ................. 361/19 |

FOREIGN PATENT DOCUMENTS

| | | |
|---|---|---|
| JP | 61-262038 A | 11/1986 |
| JP | 02-202004 A | 8/1990 |
| JP | 6009174 B | 2/1994 |
| JP | 08-330128 A | 12/1996 |
| JP | 09-084252 A | 3/1997 |
| JP | 2001274014 | 10/2001 |

OTHER PUBLICATIONS

International Search Report and Written Opinion of Application No. PCT/JP2009/069278 mailed Feb. 16, 2010.
Korean Office Action issued on Oct. 10, 2012, in Patent Application No. KR 10-2010-7024182, with English translation.
Notice of Allowance in the Corresponding Japanese Application No. 2008-289982 mailed Dec. 28, 2012.

* cited by examiner

*Primary Examiner* — Jeff Natalini
(74) *Attorney, Agent, or Firm* — Kanesaka Berner and Partners LLP

(57) ABSTRACT

The quench of the superconducting coil is desired to be detected early while suppressing the influences of the noise generated in charge and discharge of the superconducting coil. A superconducting coil quench detection apparatus detects the balance voltage of a bridge circuit formed by the superconducting coil and a resistor to output it as a quench detection signal for detecting the quench thereof. A signal indicating the hold period where the energy accumulated in the superconducting coil is held is generated. A signal included in the hold period is extracted from the quench detection signal. The quench of the superconducting coil is detected based on the extracted signal.

10 Claims, 4 Drawing Sheets

CHARGE PERIOD

HOLD PERIOD

DISCHARGE PERIOD

DETECTION APPARATUS AND METHOD FOR SUPERCONDUCTING COIL QUENCH

RELATED APPLICATIONS

The present application is based on, and claims priority from, Japanese Application Number 2008-289982, filed Nov. 12, 2008, the disclosure of which is hereby incorporated by reference herein in its entirety.

INCORPORATION BY REFERENCE

This patent application claims a priority on convention based on Japanese Patent Application No. 2008-289982. The disclosure thereof is incorporated herein by reference.

TECHNICAL FIELD

The present invention relates to a detection apparatus and method for superconducting coil quench.

BACKGROUND ART

In a superconducting coil, when the temperature or the electric current or the like do not meet certain requirements to maintain the superconducting state, the so-called quench occurs and the superconducting state is shifted to the non-superconducting state. When the quench occurs, the resistance value is increased at the part where the quench occurs, and then, rapid conversion into the thermal energy occurs due to the electric current. In order to protect superconducting material and insulating material and prevent damages thereof when the quench occurs, earlier detection of the quench is desired.

In a direct current magnet that is formed by supplying a direct current in a winding of a superconductor, the quench is detected by a measurement value of the difference in the potential between two points of the winding. However, in the case of the SMES (Superconducting Magnetic Energy Storage), which stores electric power by means of a superconducting coil and discharge the electric power as demand, same quench detection as that in the case of the direct current magnet cannot be made since a high alternation voltage is applied to the SMES from the outside upon charging and discharging. In addition, the SMES is not capable of employing a protection circuit that is formed by placing a diode in parallel to the same winding as the direct current magnet. Therefore, it is necessary for the SMES to provide a dedicated protecting means thereto.

As an example of documents of conventional techniques with regard to the detection of the quench of a superconducting coil, Japanese Laid-Open Patent Application JP-P2001-274014A is referred to here.

SUMMARY OF INVENTION

In the SMES, a high frequency noise to be generated in a winding current due to switching of a converter and a leak current via a distributed capacitance between a coil and a ground may become problems. These phenomena cause high frequency noises that are included in a detection voltage to be constantly monitored in order to detect a quench.

In more detailed explanation, a voltage to be generated upon occurrence of the quench, which is the subject of monitoring, is a product of the electric current flowing through the coil and the resistance value that is locally increased within the winding. This voltage is minute and is generated independently of an additive voltage of a main circuit upon charging and discharging. On the other hand, according to the converter for carrying out charge and discharge in the SMES, due to a switching noise, an inductance of a coil, and a difference in a distributed capacitance in the inside of the SMES and the ground, a potential difference of the subject of monitoring becomes to have variations upon charging and discharging, and this causes a noise in a voltage of the subject of monitoring. This noise makes it difficult to detect an abnormality with high accuracy.

The high frequency noise can be suppressed by inserting a low pass filter. As a reference technique, FIG. 1 illustrates an example that a quench detection circuit of the SMES is provided with a filter for controlling the high frequency noise. A SMES coil 106 is connected to a power source located at the outside of the circuit via a direct current smoothing capacitor 102 and a converter for charge and discharge 104. Nodes on the opposite ends of a winding of the SMES coil 106 are connected to the opposite ends of a voltage divider resistor 112. A variable node of a zero adjustment resistor 113 that is placed in an intermediate position of the voltage divider resistor 112 and a node 110 in a middle point of the winding of the SMES coil 106 are connected to a first input terminal and a second input terminal of an isolation amplifier 116, respectively. An output terminal of the isolation amplifier 116 is connected to an input terminal of a low pass filter 117. An output side of the low pass filter 117 and an abnormality judgment voltage set circuit 126 are connected to a first input terminal and a second input terminal of an absolute value comparator, respectively.

According to such a circuit, it is possible to judge whether or not a quench occurs based on a signal being generated by suppressing the influence of the high frequency noise by means of the low pass filter 117 from a balance voltage (it is referred to as an imbalance voltage when the balance is disturbed) of a bridge circuit formed by connecting the voltage divider resistor 112 and the zero adjustment resistor 113 in parallel to the opposite ends of the SMES coil 106.

However, there is a possibility that the following problems occurs by suppressing the noises by a filter.

(1) In a case where the noise component is large, the filter may not be capable of suppressing the noises sufficiently to detect the quench correctly.

(2) In addition, when a noise waveform included in the detected voltage is asymmetrical with respect to the plus and minus, a direct current component remains in an output signal of the filter and this may cause a false detection.

(3) Due to the decrease of the response speed by the filter, the time required for judging the quench becomes longer, and this leads to a delay in timing to start the control for protecting the coil.

(4) In a bridge circuit formed by a superconducting coil and a voltage divider resistor, the voltage generated from an error of the voltage divider resistances is large.

(5) By increasing a threshold for coping with a residual direct current component, there is a possibility that reliability is declined due to a false judgment and a delay in judgment.

A technique for an earlier detection of the occurrence of the quench is desired. Particularly, a technique for make it possible to detect occurrence of a quench early while suppressing the influence of a noise generated upon charging and discharging of the superconducting coil has been desired.

A superconducting coil quench detection apparatus according to an aspect of the present invention includes: a quench detection signal generation section for detecting a variation of a balance voltage of a bridge circuit consisting of a superconducting coil and a resistor and for outputting the detected variation as a quench detection signal for detecting quench of the superconducting coil; a hold period signal generation section for generating a hold period signal indicating a hold period during which energy accumulated in the superconducting coil is held; an abnormality judgment signal extraction section for extracting a signal included in the hold period among the quench detection signal as an abnormality judgment signal; and a quench detection section for detecting quench of the superconducting coil based on the abnormality judgment signal.

A superconducting coil quench detection method according to an aspect of the present invention includes: detecting a variation of a balance voltage of a bridge circuit consisting of a superconducting coil and a resistor and outputting the detected variation as a quench detection signal for detecting quench of the superconducting coil; generating a hold period signal indicating a hold period during which energy accumulated in the superconducting coil is held; extracting a signal included in the hold period among the quench detection signal as an abnormality judgment signal; and detecting quench of the superconducting coil based on the abnormality judgment signal.

During the hold period where the energy of the superconducting coil is held, the noise on the balance voltage for detecting the resistance of the superconducting coil is small, so that the influence due to a voltage distribution by an inductance of the superconducting coil of the bridge circuit and an error variation of the resistance value of a voltage divider resistor is also small. By extracting the detection signal during this hold period and using this detection signal for judgment of a quench, it becomes possible to monitor and detect a quench with high reliability.

According to the present invention, a technique is provided, which makes it possible to detect a quench earlier while suppressing an influence due to the noise that is generated upon charging and discharging of a superconducting coil and a detection error in the bridge circuit under a condition of a high potential difference.

DETAILED DESCRIPTION OF THE PREFERRED EMBODIMENTS

Referring to the accompanying drawings, embodiments according to the present invention will be described below. A quench detection circuit according to the present embodiment is used for monitoring and detecting a quench of a superconducting coil to accumulate energy in a SMES. In the superconducting coil of the SMES, it is difficult to judge whether or not a quench occurs on the basis of the absolute value of a terminal voltage of the superconducting coil since the coil current is always varied and further, this superconducting coil charges and discharges an electric current to and from a high voltage power source. Therefore, a bridge circuit is formed by connecting a resistor for detecting the voltage at a middle point in parallel to a pair of coils having a same specification placed in one current circuit, and the imbalance voltage of the bridge circuit is used as a signal for detecting a quench.

Figure 1:
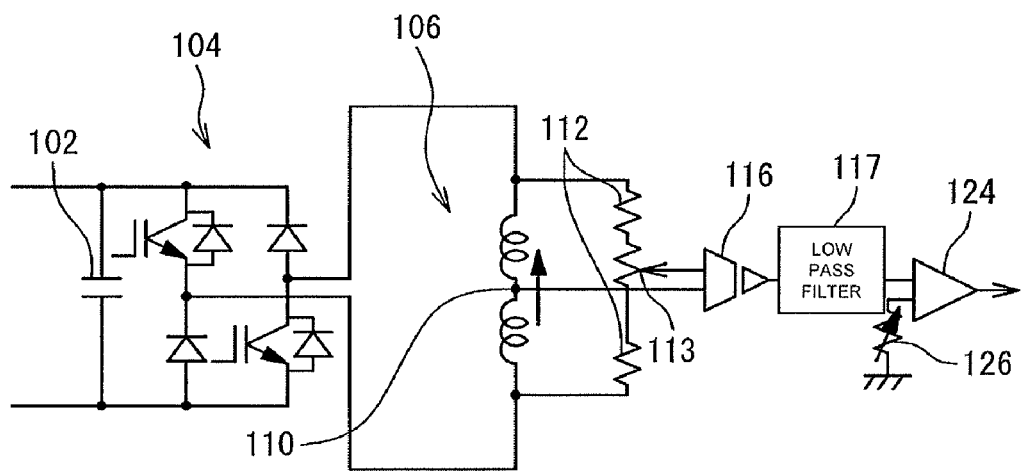
FIG. 1 illustrates a quench detection circuit of the SMES according to a reference technique.
Figure 2:
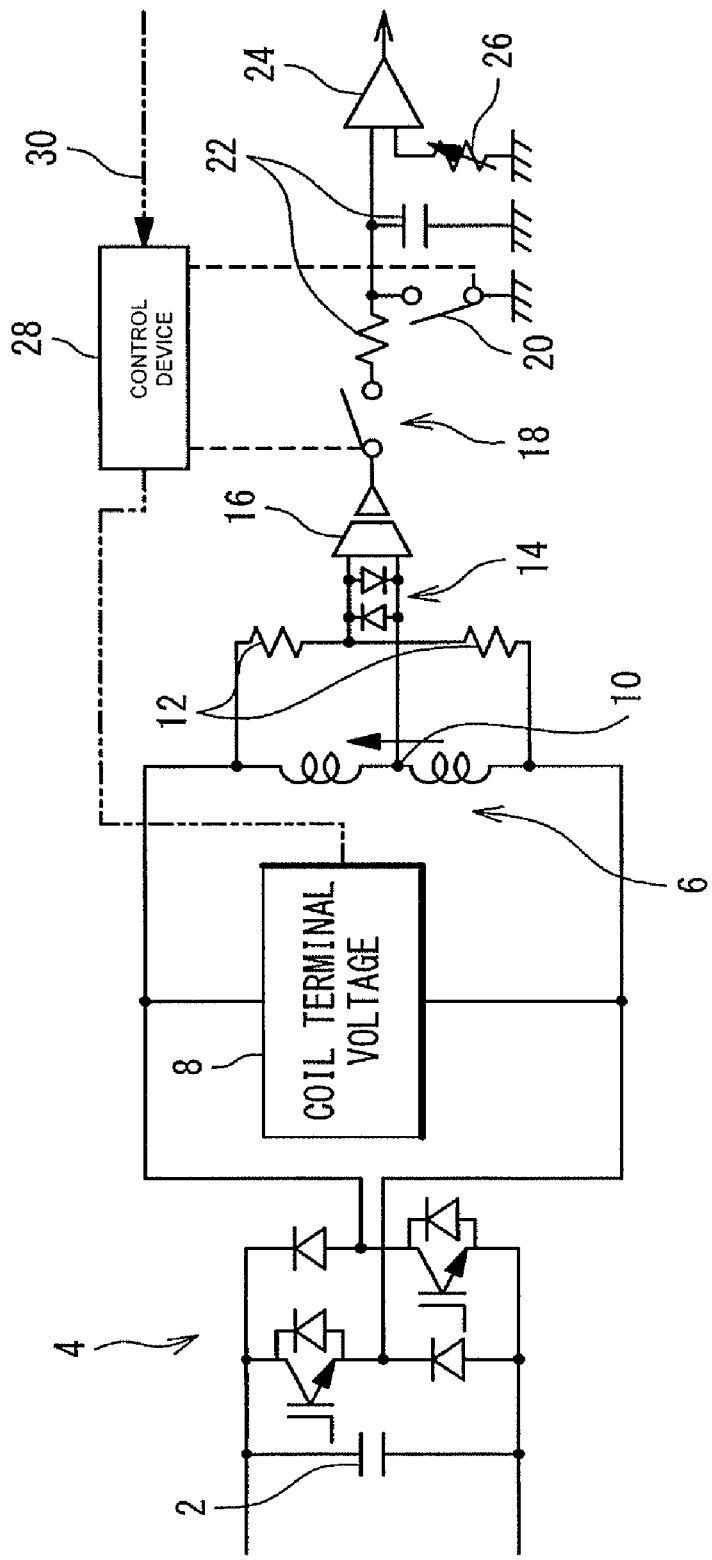
FIG. 2 illustrates a quench detection circuit according to an embodiment of the present invention.

FIG. 2 illustrates the quench detection circuit according to the present embodiment. To a SMES coil 6, a direct current smoothing capacitor 2 and a converter for charge and discharge 4 that are similar to the direct current smoothing capacitor 102 and the converter for charge and discharge 104 according to the reference technique shown in FIG. 1, respectively, are connected. The SMES coil 6 is provided with a pair of two coils with a same specification with respect to each other. To a node 10 located on a middle point of these two coils, a wiring is connected. Between the terminals on the opposite ends of the SMES coil 6, a coil terminal voltage detection circuit 8 is connected.

By connecting a voltage divider resistor 12 between the terminals on the opposite ends of the SMES coil 6, a bridge circuit is formed, which has the SMES coil 6 and the voltage divider resistor 12 that are arranged in parallel with each other. This bridge circuit functions as a generation section of a quench detection signal. Connecting the node 10 and the node located on the middle point of the voltage divider resistor 12 to a first input terminal and a second input terminal of an isolation amplifier 16, respectively, a balance voltage is detected. A clip circuit 14 that is formed by diodes provides a clip between the input terminals of the isolation amplifier 16.

An output terminal of the isolation amplifier 16 is connected to an input of an RC integrating circuit 22 via an integration switch 18. To an RC integrating circuit 22, a reset switch 20 for causing short circuit in the opposite ends of the capacitor is connected. A control device 28 controls ON and OFF of the integration switch 18 and the reset switch 20, respectively. A rear stage side of the RC integrating circuit 22 is inputted in a first input terminal of an absolute value comparator 24. In a second input terminal of the absolute value comparator 24, a signal indicating a threshold for an abnormality judgment that is generated by an abnormality judgment voltage set circuit 26 is inputted. The integrating circuit and the abnormality judging circuit may be digitalized together with the control device.

The operation using such a circuit for monitoring whether or not a quench occurs in the SMES coil 6 and for early detecting a quench when the quench is generated will be described below. The SMES coil 6 charges and discharges an electric current to and from an external circuit via the converter for charge and discharge 4. The quench detection circuit obtains an imbalance voltage of the bridge circuit.

A threshold of the imbalance voltage for detecting the abnormality of the quench is set at about 0.1V at the highest. The voltage generated by the quench is determined by the product of the increase in resistance of the superconducting coil due to the quench and the electric current flowing through the coil and has independent from the input voltage value of the bridge circuit, so that the quench detection circuit carries out detection of the absolute value in a holding state where an error voltage of the bridge circuit itself becomes lowest. In the holding state, the input of the bridge circuit is short-circuited by the diode and the switching element of the converter for charge and discharge to be a voltage of approximately two diodes. Therefore, the highest voltage of the output of the bridge circuit, from which the influence of the occurrence of the quench is removed, becomes the voltage for one diode, which is approximately half the voltage of two diodes. Then, a high-speed response of the isolation amplifier in a required voltage range is ensured by clipping the obtained imbalance voltage by a clip circuit at about ±1V, preventing an excessive input of the isolation amplifier, and reducing a voltage amplitude to a necessity minimum.

The imbalance voltage for which an excessive voltage being not necessary and causing a bad influence in charging and discharging is clipped is amplified by the isolation amplifier 16 to be outputted as an amplified signal. The integration switch 18 is placed between the isolation amplifier 16 and the RC integrating circuit 22. Timing of open and close of this integration switch 18 is controlled by a control signal from the control device 28.

The quench detection signal outputted from the isolation amplifier 16 is extracted (sampled) as an abnormality judgment signal that is used for judgment of the quench in a zone of time when the integration switch 18 has been turned ON. In accordance with the input of the abnormality judgment signal, electric charges are accumulated in the capacitor of the RC integrating circuit 22. The quench detection signal in the time zone when the integration switch 18 is turned OFF is excluded from the subject of monitoring. The absolute value comparator 24 carries out the judgment of abnormality by comparing the output voltage of the RC integrating circuit 22 with the threshold for the abnormality judgment. Accordingly, it is possible to detect a quench with high reliability by controlling to turn ON the integration switch 18 in a time zone where a stability condition is satisfied (a zone when the bridge circuit is stable and balanced and the imbalance voltage is expected to be close to 0) and turn OFF the integration switch 18 in a zone where the disturbance of the imbalance voltage is large.

Figure 3:
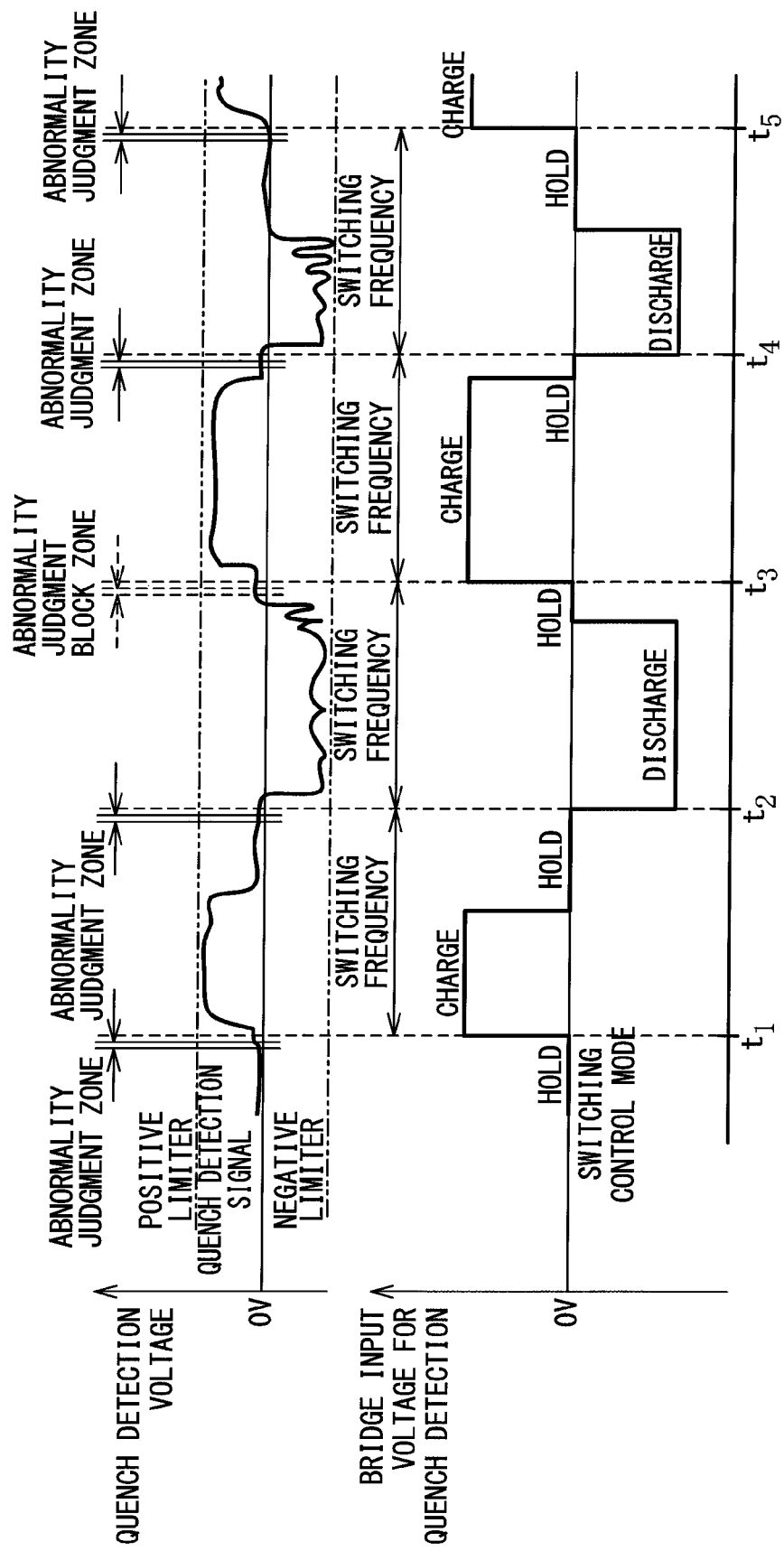
FIG. 3 illustrates a period for sampling a quench detection signal.

FIG. 3 illustrates an example of such a control. The SMES coil 6 is repeating a charge operation, a holding operation of the electric energy by forming a closed circuit in a superconducting state, and a discharge operation. In addition, the hold period is surely secured for more than a certain minimal time for each constant period of the switching frequency. When the SMES is normally operated without a quench, among of these the imbalance voltage (the quench detection signal of FIG. 3 shows a signal indicating this imbalance voltage clipped) is stabilized in the holding time. Particularly, during the hold period, the stable state can be obtained in a time zone near the end of the hold period. It is a period of time a little before the hold period is shifted to the discharge period where most stable imbalance voltage detection can be expected. In FIG. 3, a period of time when these stability conditions are satisfied is illustrated as an "abnormality judgment zone" during which a signal is extracted in order to judge whether or not there is the abnormality of the superconducting state.

According to this detection method, it is judged whether or not there is the abnormality by sampling a signal in a period of time that the stability conditions are satisfied and a system is most stable, so that it is not required to use a filter for removing the noise, which filter is required for a conventional circuit for detecting a quench. Therefore, the quench can be detected for a short time when the abnormality is generated without an attenuation and a delay caused by the filter.

In order to carry out the above-described control, the control device 28 is provided with a signal extraction section for judging abnormality. This signal extraction section for judging abnormality turns ON the integration switch 18 during the abnormality judgment zone as shown in FIG. 3. Specifically, the integration switch 18 is turned ON during the hold period. Preferably, the integration switch 18 is turned ON during the abnormality judgment zone, which is set from the end of the hold period within a predetermined time. More preferably, the integration switch 18 is turned ON during the abnormality judgment zone, which is set from the end of the hold period after the charge period within a predetermined time.

In order to carry out such control, the control device 28 is required to obtain information indicating the abnormality judgment zone. Particularly, it is required to obtain a hold period signal indicating the hold period that the energy accumulated in the superconducting coil 6 is held. Therefore, it is considered that the control device of the converter for charge and discharge 4 can input a detection implementation timing signal 30 of the quench detecting apparatus in the control device 28 and this signal can be used for detection for a reason that the control device of the converter for charge and discharge 4 has a generating capability of this signal 30 rather than it is grasping and controlling all of timing and time of charge and discharge and holding. In the case where the timing signal for detection of the quench is not transmitted by means of the converter for charge and discharge, it is possible to generate and use a timing signal due to variation of the input voltage of the bridge circuit for detecting the quench. In other words, the control device 28 is provided with a hold period generation section for generating a hold period signal. The information indicating this hold period is specifically given as follows.

A coil terminal voltage that is an input voltage of the bridge circuit for detecting quench, a high voltage that is approximately equal to the voltage of the direct current smoothing capacitor is applied or generated in the electric current direction upon charging and in the reverse direction of the electric current direction upon discharging. During a current hold period, no voltage is applied and is generated from the direct current smoothing capacitor, and an input of the bridge circuit is short-circuited. The sum of ON voltages of the diode and the switching element are generated, however, a state of this current hold period can be assumed to be a state that no voltage is applied or generated since this sum of ON voltages is extremely lower compared to the voltage of the direct current smoothing capacitor. A switching frequency can be obtained by measuring the timings of ending of holding or starting of charge and discharge and by calculating the intervals of the timing. It can be recognized that where the control region is located in a charge or discharge from the polarity of the input voltage. The length of time for charge and discharge can be known based on the time that the input voltage is shifted from a high voltage to an approximately zero voltage. Based on these results, the abnormality judgment zone can be set.

Figure 4A:
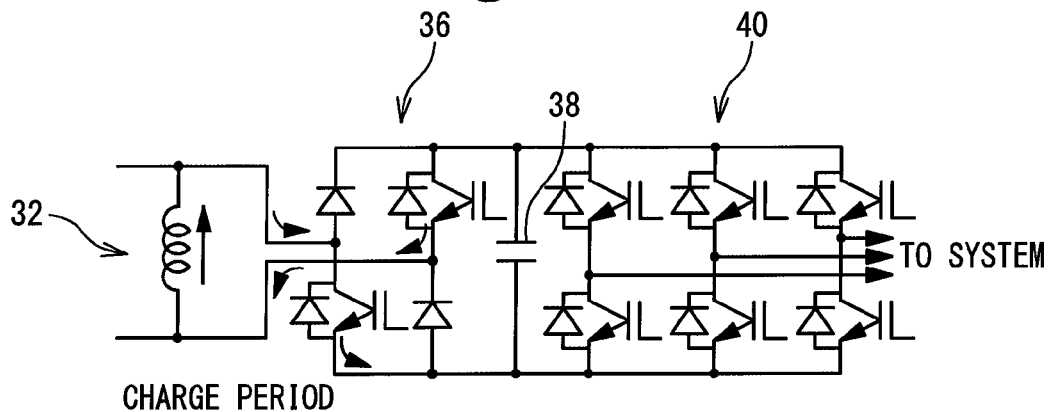
FIG. 4A illustrates an electric current of SMES coil and a charge and discharge circuit upon charging.
Figure 4B:
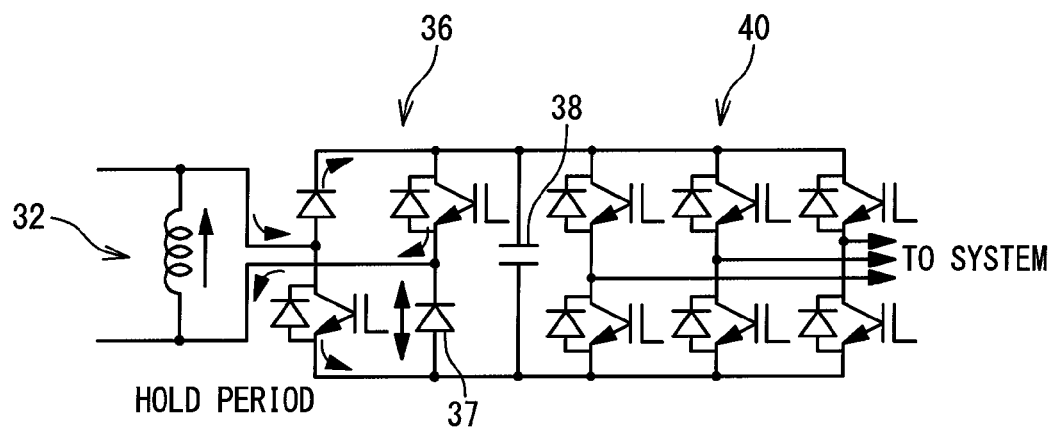
FIG. 4B illustrates an electric current of a SMES coil and the charge and discharge circuit when holding an electric current.
Figure 4C:
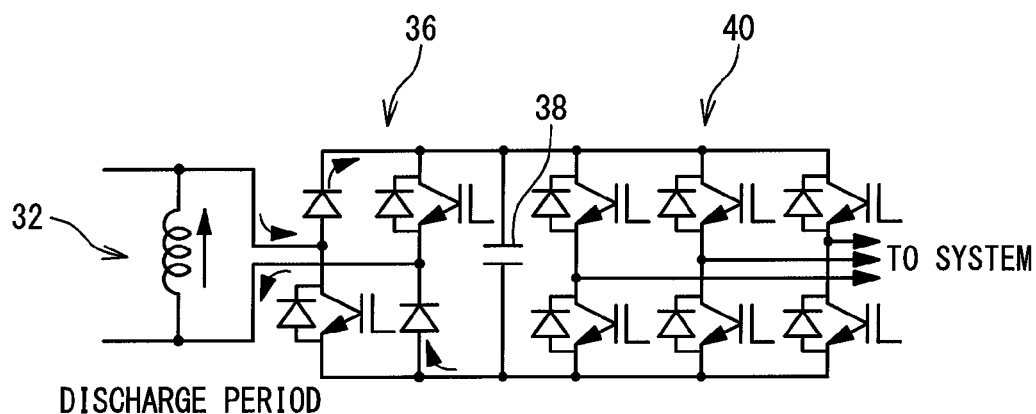
FIG. 4C illustrates an electric current of a SMES coil and the charge and discharge circuit upon discharge.

The stability of the quench detection signal will be further described below. FIGS. 4A to 4C illustrate a SMES coil 32, a charge and discharge circuit, and a circuit for connecting to a power system. The arrows in each of FIGS. 4A to 4C indicate electric currents. The SMES coil 32 (corresponding to the SMES coil 6 of FIG. 2) is connected to the side of the power system via a current-voltage converter 36 (corresponding to the converter for charge and discharge 4 of FIG. 2), a smoothing capacitor 38, and a power system interconnection inverter 40.

FIG. 4A shows the charge period. Electric currents pass through IGBTs of the current-voltage converter 34. FIG. 4C shows the discharge period. Electric currents pass through diodes. FIG. 4B shows a time where the discharge period is switched to the current hold period. When the state thereof is shifted from discharging into holding, the diode 37 of the current-voltage converter 36 is reversely recovered. Due to this reverse recovery, a transient signal waveform is disturbed. The decrease of electric current in this case becomes approximately equal to the decrease of electric current upon continuous discharge under a condition for preventing excessive voltage when an abnormality occurs and protection is required. Therefore, in a case where the discharge operation is long and the subsequent hold period is short, during this period of time, the integration switch 18 is turned OFF even near the end of the hold period and the signal is not used for judging the abnormality. An example of such a period of time is illustrated as an "abnormality judgment block zone" in FIG. 3.

Under the above-described controls, the quench signal is not detected just in real time. The quench is monitored on the basis of the data that is discretely sampled from time-serial signal. However, in general, the converter for connecting the SMES to the external power system carries out switching at a frequency of several hundreds of Hz constantly in order to carry out controlling such as charge, discharge and holding of the electric current of the superconducting coil. There is a condition that the signal is stabilized for about 100μ seconds at minimum in synchronization with each switching operation. Therefore, even by the sampling at intermittent timing as described above, an occasion for checking can be obtained within 10 milliseconds. This is the order which can be assumed to be the real time with reference to the speed at which the thermal spot is spread when a quench occurs (the time constant of abnormality spread), and is a high speed enough to carry out controlling for detecting the quench and protecting the circuit.

Even if the integration switch 18 and the RC integrating circuit 22 are not provided with, it is possible to judge the abnormality by means of the absolute value comparator 24 on the basis of the output of the isolation amplifier 16. In this case, the judgment of abnormality is carried out on the basis of the quench detection signal in the abnormality judgment zone of one time.

Turning ON the integration switch 18 in a plural times of abnormality judgment zones, a cumulative value of the quench detection signal can be prepared as an evaluation voltage by the RC integrating circuit 22. The abnormality is judged on the basis of this evaluation voltage so that the abnormality can be judged with higher reliability. The evaluation voltage is automatically reset by a resistor till a next abnormality judgment zone. Alternatively, in a case where the evaluation voltage is generated in a plural times of abnormality judgment zones, by turning ON the reset switch 20 by a reset signal transmitted by the control device 28 after evaluation with the absolute value comparator 24, forced rest is carried out.

According to the above-described present embodiments, following effects can be obtained.
(1) In the quench detection of the SMES coil, it is possible to avoid undesirable influences of the transient phenomena under the switching operation of the converter.
(2) In the quench detection of the SMES coil, it is possible to reliably avoid undesirable influences of the noise that is included in the voltage of the main circuit of the converter.
(3) It becomes possible to judge the abnormality at high speed referring to the time order of each carrier frequency of a chopper of a voltage-fed converter and a current-fed inverter.
(4) With respect to the occurrence status of the quench voltage, quantitative data with less error can be obtained.

The present invention has been described referring to some embodiments as above, however, it is obvious for those skilled in the art that these embodiments are referred to merely in order to demonstrate the invention and should not be referred to for limiting the contents of the scope of the claims.

What is claimed is:

1. A superconducting coil quench detection apparatus comprising:
   a quench detection signal generation section configured to detect a variation of a balance voltage of a bridge circuit consisting of a superconducting coil and a resistor and to output the detected variation as a quench detection signal for detecting quench of the superconducting coil;
   a hold period signal generation section configured to generate a hold period signal indicating a hold period during which energy accumulated in the superconducting coil is held;
   an abnormality judgment signal extraction section configured to extract a signal included in the hold period among the quench detection signal as an abnormality judgment signal; and
   a quench detection section configured to detect quench of the superconducting coil based on the abnormality judgment signal
   wherein the abnormality judgment signal is extracted from a period in a predetermined time from an end of the hold period which is before a discharge period in which energy accumulated in the superconducting coil is discharged.

2. The superconducting coil quench detection apparatus according to claim 1, wherein the abnormality judgment signal is extracted from a predetermined period until an end of the hold period.

3. The superconducting coil quench detection apparatus according to claim 1, further comprising:
   a coil terminal voltage detection section configured to detect an inter-terminal voltage between terminals of the superconducting coil, and
   the hold period signal generation section is configured to set the hold period based on the inter-terminal voltage.

4. The superconducting coil quench detection apparatus according to claim 1, wherein the hold period is repeated a plurality of times, and
   the superconducting coil quench detection apparatus further comprises:
   an integrating circuit configured to input the abnormality judgment signal included in the plurality of hold times, and
   the quench detection section is configured to detect quench of the superconducting coil based on an output voltage of the integrating circuit.

5. The superconducting coil quench detection apparatus according to claim 1, further comprising:
   a clipping circuit configured to clip an excessive variation of the balance voltage.

6. A superconducting coil quench detection method comprising:
   detecting a variation of a balance voltage of a bridge circuit consisting of a superconducting coil and a resistor and outputting the detected variation as a quench detection signal for detecting quench of the superconducting coil;
   generating a hold period signal indicating a hold period during which energy accumulated in the superconducting coil is held;
   extracting a signal included in the hold period among the quench detection signal as an abnormality judgment signal; and
   detecting quench of the superconducting coil based on the abnormality judgment signal
   wherein the abnormality judgment signal is extracted from a period in a predetermined time from an end of the hold period which is before a discharge period in which energy accumulated in the superconducting coil is discharged.

7. The superconducting coil quench detection method according to claim 6, wherein the abnormality judgment signal is extracted from a predetermined period until an end of the hold period.

8. The superconducting coil quench detection method according to claim 6, further comprising:
  detecting an inter-terminal voltage between terminals of the superconducting coil, and
  setting the hold period based on the inter-terminal voltage at the generating the hold period signal.

9. The superconducting coil quench detection method according to claim 6, wherein the hold period is repeated a plurality of times, and
  the superconducting coil quench detection method further comprises:
  inputting the abnormality judgment signal included in the plurality of hold times to an integrating circuit, and
  detecting quench of the superconducting coil based on an output voltage of the integrating circuit at the detecting quench.

10. The superconducting coil quench detection method according to claim 6, further comprising:
  clipping an excessive variation of the balance voltage.

* * * * *